United States Patent [19]
Shirahata et al.

[11] Patent Number: 4,467,082
[45] Date of Patent: Aug. 21, 1984

[54] ORGANOPOLYSILOXANE PHOTOSENSITIZERS AND METHODS FOR THEIR PREPARATION

[75] Inventors: Akihiko Shirahata; Keiichi Kishimoto, both of Chiba, Japan

[73] Assignee: Dow Corning Corporation, Midland, Mich.

[21] Appl. No.: 358,401

[22] Filed: Mar. 15, 1982

[51] Int. Cl.$^3$ ............................................. C08G 77/00
[52] U.S. Cl. ..................................... 528/43; 528/10; 528/25; 528/26; 528/33; 556/436
[58] Field of Search .................... 556/436; 528/43, 10, 528/25, 26, 33

[56] References Cited
U.S. PATENT DOCUMENTS
4,278,804  7/1981  Ashby et al. ........................... 528/43

Primary Examiner—Melvyn I. Marquis
Attorney, Agent, or Firm—George A. Grindahl

[57] ABSTRACT

Novel photosensitizers are disclosed which are particularly useful in photopolymerizable organopolysiloxane and silicone resins. The photosensitizers are themselves organopolysiloxanes which contain at least one silicon-bonded benzophenone-containing radical. Synthesis methods are disclosed for preparing these photosensitizers which employ, as starting materials, an alkenyloxy-substituted benzophenone and a silicone compound containing at least one silicon-bonded hydrogen atom.

16 Claims, No Drawings

ORGANOPOLYSILOXANE PHOTOSENSITIZERS AND METHODS FOR THEIR PREPARATION

BACKGROUND OF THE INVENTION

This invention relates to novel photopolymerization sensitizers and the methods for their preparation comprising bonding benzophenone derivatives into organopolysiloxanes.

Various photosensitive or photopolymerizable (hereafter to be called photosensitive) resins are conventionally known. Several photopolymerization sensitizers have been developed or proposed for the photopolymerization of these photosensitive resins. The required characteristics for these photopolymerization sensitizers are good sensitizing action and good miscibility with the photosensitive resins. If its miscibility with photosensitive resins is poor, the polymerization sensitizer will separate from the photosensitive resins and the desired sensitization action cannot then be adequately achieved. When the photosensitive resin polymerizes and hardens, nonuniformities therein are formed and the sensitizer is deposited or separated from the hardened photosensitive resin. In cases where photosensitive resins blended with the photopolymerization sensitizer are stored, long-term storage is a problem.

There are many types of conventionally known photosensitive silicone resins and photosensitive organopolysiloxanes and it is necessary to use photopolymerization sensitizers with these resins. For this purpose, sensitizers such as 2, 6-dichloro-4-nitroaniline, 2, 4-dinitrophenol and other aromatic compounds; Michler's ketone, benzophenone, benzoin, and other ketones; and benzoquinone and other quinones are known to be effective. However, these sensitizers have the drawbacks and disadvantages described above since they are poorly miscible with photosensitive organopolysiloxanes. Sensitizers which are miscible with photosensitive organopolysiloxanes have been proposed in Japanese Patent Sho 51 (1976)-48794. They are benzophenone derivatives substituted with organosiloxy groups. However, they are not perfectly miscible with photosensitive organopolysiloxanes and their syntheses are also time-consuming. Therefore, they have no practical use. This invention was achieved as the result of research by the present inventors in order to overcome these disadvantages of the conventional technologies.

BRIEF SUMMARY OF THE INVENTION

It is an object of this invention to provide novel organopolysiloxane photosensitizers. It is another object of this invention to provide photosensitizers which are readily miscible with photosensitive silicone resins and with photosensitive organopolysiloxanes. It is a further object of this invention to provide photosensitizers which are relatively easily prepared and methods for their preparation.

These objects, and others which will become obvious after considering the following specification and appended claims, are obtained by chemically bonding certain alkenyloxy-substituted benzophenone derivatives to organopolysiloxanes or organosilanes which bear silicon-bonded hydrogen atoms and optionally, further polymerizing the product by a siloxane-polymerizing reaction.

DETAILED DESCRIPTION OF THE INVENTION

The present invention relates to an organopolysiloxane photosensitizer comprising an average of more than two siloxane units, of which at least an average of one siloxane unit per organopolysiloxane molecule has the formula $Q_aR^4_bSiO_{(4-a-b)/2}$, wherein Q denotes a benzophenone-containing group having the formula

$(R^1_mC_6H_{5-m})\overset{O}{\underset{\|}{C}}(C_6H_{4-n}R^2_nOR^3)-$;

$R^1$ and $R^2$ each denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; $R^3$ denotes a divalent hydrocarbon group having from 2 to 10 carbon atoms; $R^4$ denotes a monovalent hydrocarbon group or a halogenated monovalent hydrocarbon group; m is an integer of from 1 to 5, n is an integer of from 1 to 4, a is an integer of from 1 to 3, b is an integer of from 0 to 2 and $a+b$ is an integer of from 1 to 3.

The present invention further relates to a method for preparing an organopolysiloxane photosensitizer comprising an average of more than two siloxane units, of which at least an average of one siloxane unit per organopolysiloxane molecule has the formula $Q_aR^4_bSiO_{(4-a-b)/2}$, said method comprising reacting, by a hydrosilylation reaction, an alkenyloxybenzophenone reactant having the formula

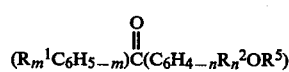
$(R^1_mC_6H_{5-m})\overset{O}{\underset{\|}{C}}(C_6H_{4-n}R^2_nOR^5)$ and an organohydrogenpolysiloxane reactant containing more than two siloxane units and at least one silicon-bonded hydrogen atom per molecule, wherein Q denotes a benzophenone-containing group having the formula

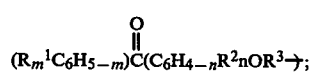
$(R^1_mC_6H_{5-m})\overset{O}{\underset{\|}{C}}(C_6H_{4-n}R^2nOR^3)-$;

at each occurrence $R^1$ and $R^2$ denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; $R^3$ denotes a divalent hydrocarbon group having from 2 to 10 carbon atoms; $R^4$ denotes a monovalent hydrocarbon group or a halogenated monovalent hydrocarbon group; $R^5$ denotes an aliphatically unsaturated monovalent hydrocarbon group having the same number of carbon atoms as the $R^3$ group; m is an integer of from 1 to 5, n is an integer of from 1 to 4, a is an integer of from 1 to 3, b is an integer of from 0 to 2 and $a+b$ is an integer of from 1 to 3; the $R^5$ group becoming the $R^3$ group during said hydrosilylation reaction.

The present invention also relates to a method for preparing an organopolysiloxane photosensitizer comprising an average of more than two siloxane units, of which an average of at least one siloxane unit per organopolysiloxane molecule has the formula $Q_aR^4_bSiO_{(4-}$ $a\text{-}b)/2$, said method comprising (A) reacting, by a hydrosilylation reaction to form an adduct, an alkenyloxybenzophenone reactant having the formula

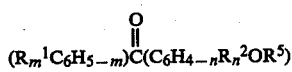

and a silane bearing at least one silicon-bonded hydrogen atom and at least one silicon-bonded hydrolyzable group or a siloxane bearing at least two siloxane units and at least one silicon-bonded hydrogen atom; and (B) polymerizing the adduct or copolymerizing the adduct with another silane bearing at least one silicon-bonded hydrolyzable radical or with a siloxane, both being free of Q groups, to provide the organopolysiloxane photosensitizer, wherein Q denotes a benzophenone-containing group having the formula

at each occurrence $R^1$ and $R^2$ denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; $R^3$ denotes a divalent hydrocarbon group having from 2 to 10 carbon atoms; $R^4$ denotes a monovalent hydrocarbon group or a halogenated monovalent hydrocarbon group; $R^5$ denotes an aliphatically unsaturated monovalent hydrocarbon group having the same number of carbon atoms as the $R^3$ group; m is an integer of from 1 to 5, n is an integer of from 1 to 4, a is an integer of from 1 to 3, b is an integer of from 0 to 2 and $a+b$ is an integer of from 1 to 3; the $R^5$ group becoming the $R^3$ group during said hydrosilylation reaction.

The photopolymerization sensitizers of the present invention are organopolysiloxanes having an average of at least one siloxane unit per molecule which bears a silicon-bonded benzophenone derivative group. This siloxane unit has the formula $Q_aR_b^4SiO_{(4-a-b)/2}$ wherein Q represents the benzophenone derivative group and has the formula

In the above siloxane unit formula a has a value of 1, 2 or 3, b has a value of 0, 1 or 2 and the sum of $a+b$ has a value of 1, 2 or 3, thereby providing siloxane units having the formulae $QSiO_{3/2}$, $QR^4SiO_{2/2}$, $QR_2^4SiO_{1/2}$, $Q_2SiO_{2/2}$, $Q_2R^4SiO_{1/2}$ and $Q_3SiO_{1/2}$. Preferably, a has a value of 1, as illustrated by the first three siloxane units listed.

In the above formula for Q, $R^1$ and $R^2$ each denote hydrogen atoms, hydroxyl groups, amino groups, halogen atoms such as fluorine, chlorine, bromine and iodine; monovalent hydrocarbon groups containing 1-10 carbons such as methyl groups, ethyl groups, n-propyl groups, n-butyl groups, t-butyl groups, hexyl groups and octyl groups; alkoxy groups such as methoxy groups, ethoxy groups and propoxy groups; thioalkoxy groups, such as thiomethoxy groups and thioethoxy groups; and dialkylamino groups, such as dimethylamino groups, diethylamino groups and methylpropylamino groups. In a preferred embodiment of this invention, $R^1$ and $R^2$ are hydrogen atoms.

In the above formula for Q, m has a value of from 1 to 5, preferably from 1 to 3, and n has a value of from 1 to 4, preferably from 1 to 3. Of course, in the preferred embodiment wherein $R^1$ and $R^2$ both are hydrogen, the values of m and n are effectively, and equivalently, any and all values from 0 to 5 and 0 to 4 respectively.

$R^3$ denotes a divalent hydrocarbon group having from 2 to 10 carbon atoms such as ethylene groups, propylene groups, isopropylene groups and butylene groups. Preferably, $R^3$ is a propylene group.

A highly preferred Q group therefore has the formula

In the above siloxane unit formula, $R^4$ denotes a monovalent hydrocarbon group or a halogenated monovalent hydrocarbon group. Examples of suitable monovalent hydrocarbon groups include alkyl groups such as methyl groups, ethyl groups, propyl groups and octyl groups; aryl groups such as phenyl groups, tolyl groups and xylyl groups; cycloaliphatic groups such as cyclohexyl groups; and arylalkyl groups such as benzyl groups, 2-phenylethyl groups and 2-phenylpropyl groups. Examples of suitable halogenated monovalent hydrocarbon groups include 3-chloropropyl groups, 3-chloro-2-methylpropyl groups, 3,3,3-trifluoropropyl groups and chlorophenyl groups.

The organopolysiloxane sensitizers of this invention can contain, in addition to siloxane units bearing Q groups, siloxane units which are free of Q groups. Said siloxane units free of Q groups preferably have the formula $R_c^4H_dSiO_{(4-c-d)/2}$ wherein $R^4$ denotes those groups delineated above. The values of c, d and $c+d$ can be, independently, 0, 1, 2 or 3. Preferably, c has a value of 1, 2 or 3 and d has a value of 0 or 1 thereby providing siloxane units having the formulae $R^4SiO_{3/2}$, $R_2^4SiO_{2/2}$, $R_3^4SiO_{1/2}$, $R^4HSiO_{2/2}$ and $R_2^4HSiO_{1/2}$.

Examples of suitable siloxane units free of Q groups include dimethylsiloxane, methylvinylsiloxane, methylphenylsiloxane, diphenylsiloxane, methyloctylsiloxane, methyl(3,3,3-trifluoropropyl)siloxane, methyl(3-chloropropyl)siloxane, and other diorganosiloxanes; trimethylsiloxane, dimethylvinylsiloxane, dimethylphenylsiloxane, methylphenylvinylsiloxane, dimethyl(3,3,3-trifluoropropyl)siloxane, and other triorganosiloxanes; methylsiloxane, propylsiloxane, vinylsiloxane, phenylsiloxane, 3,3,3-trifluoropropylsiloxane, and other monoorganosiloxanes; methyl hydrogen siloxane, dimethylhydrogen siloxane, hydrogen siloxane, and other siloxanes containing hydrogen atoms directly bonded to silicon atoms.

The structure of the organopolysiloxane photosensitizer can be linear, branched, cyclic, or network. Its degree of polymerization, i.e. the number of siloxane units, is greater than 2 with an upper limit as high as the maximum possible degree of polymerization, generally about 10,000. However, it is preferable for the degree of polymerization to be less than 1,000 from the viewpoint of the miscibility of the sensitizer. It is sufficient that each molecule have at least one group possessing the benzophenone derivative structure. It is also sufficient that each molecule have at least one organosiloxane unit containing this group. At the upper limit, the organosiloxane units can all contain a group possessing the benzophenone derivative structure. Nevertheless, if the number of the groups possessing the benzophenone derivative structure is too low, sensitization will be insufficient. If the number is too high, the miscibility with photosensitive resins, especially with photosensitive silicone resins and photosensitive organopolysiloxanes, will decrease. Therefore, it is preferable to have this group present at 0.2% to 50% of the total number of organic groups ($R^4+Q$) in each molecule.

A preferred embodiment of the present invention is an organopolysiloxane photosensitizer wherein all $R^4$ groups are methyl groups. The resulting methyl-containing photosensitizers are particularly useful in the methyl silicone photocurable resins delineated below.

A particularly useful embodiment of the present invention is the fluid organopolysiloxane photosensitizers, illustrated by the examples disclosed below and encompassed by the general formula $R_3^4SiO(R_2^4SiO)_x(R^4HSiO)_y(R^4QSiO)_zSiR_3^4$. Herein $R^4$ and Q are as delineated above, preferably $CH_3$ and $$\underset{\text{O}}{\overset{\parallel}{C_6H_5CC_6H_4OCH_2CH_2CH_2-}}$$

respectively, and x, y and z have average values such that their sum is less than 1000 and z is at least 1. The values of x and y can both be zero; however the value of x is typically greater than zero.

The organopolysiloxane photosensitizers of this invention can be prepared by two general methods, both comprising a hydrosilylation reaction between an alkenyloxybenzophenone reactant and a reactant bearing at least one siliconbonded hydrogen atom, and both comprising an aspect of this invention. Other methods of preparation may also be suitable.

In these two general methods of preparation the alkenyloxybenzophenone reactant has the formula $$\underset{\text{O}}{\overset{\parallel}{(R_m^1C_6H_{5-m})C(C_6H_{4-n}R_n^2OR^5)}}$$

wherein $R^1$ and $R^2$ denote the same general and preferred groups denoted above and m and n denote the same general and preferred integers noted above. These groups and integers are carried, unchanged in these two general methods, from the alkenyloxybenzophenone reactant into the organopolysiloxane photosensitizer.

The $R^5$ group of the alkenyloxybenzophenone reactant is an aliphatically unsaturated monovalent hydrocarbon group having the same number of carbon atoms, i.e. 2 to 10, as the $R^3$ group denoted above and becomes said $R^3$ group after the hydrosilylation reaction with the silicon-bonded hydrogen atom. Examples of suitable $R^5$ groups include $-CH=CH_2$, $-CH_2CH=CH_2$, $$-CH_2\underset{\overset{|}{CH_3}}{C}=CH_2,$$

and $-CH_2CH=CHCH_3$. Of course, it is to be understood that whereas a given $R^5$ group provides an $R^3$ group having the same number of carbon atoms after the hydrosilylation reaction, the structure of the resulting $R^3$ group can vary. For example, an $R^5$ group having the structure $-CH_2CH=CH_2$ group can provide an $R^3$ group having the structure $-CH_2CH_2CH_2-$ or $$-CH_2\underset{\overset{|}{CH_3}}{CH}CH_3,$$

depending on the mode of addition of the reacting silicon atom and the reacting hydrogen atom of the reactant bearing at least one silicon-bonded hydrogen atom.

Examples of alkenyloxybenzophenone derivatives are o-vinyloxybenzophenone, p-vinyloxybenzophenone, o-allyloxybenzophenone, p-allyloxybenzophenone, 2-allyloxy-4-methoxybenzophenone, 4,4'-diallyloxybenzophenone, 3,5-dichloro-4-allyloxybenzophenone, 2-allyloxy-5-methylbenzophenone, o-methallyloxybenzophenone, p-methallyloxybenzophenone, 2-methallyloxy-4-methoxybenzophenone, 4,4'-dimethallyloxybenzophenone, 3,5-dichloro-4-methallyloxybenzophenone, 2-methallyloxy-5-methylbenzophenone, o-crotyloxybenzophenone, p-crotyloxybenzophenone, 2-crotyloxy-4-methoxybenzophenone, 4,4'-dicrotyloxybenzophenone, 3,5-dichloro-4-crotyloxybenzophenone, and 2-crotyloxy-5-methylbenzophenone.

The alkenyloxybenzophenone derivative to be used in this synthesis can be synthesized by a conventionally known ether-linkage-formation reaction between readily available substituted or unsubstituted hydroxybenzophenone and an alkenyl halide. In other words, it can be obtained by a reaction between the substituted or unsubstituted hydroxybenzophenone and an alkenyl halide by use of a solvent such as ether, tetrahydrofuran, acetone, dimethoxy ethane, dimethylsulfoxide, or dimethylformamide in the presence of a base such as sodium amide, potassium carbonate, triethylamine, sodium hydroxide, potassium hydroxide, barium oxide, silver oxide, or sodium hydride. If necessary, a catalyst such as an iodide, for example, potassium iodide, can be added. Examples of specific hydroxybenzophenone derivatives are o-hydroxybenzophenone, p-hydroxybenzophenone, 2-hydroxy-4-methoxybenzophenone, 4,4'-dihydroxybenzophenone, 3,5-dichloro-4-hydroxybenzophenone, and 2-hydroxy-5-methylbenzophenone. Examples of alkenyl halides are vinyl chloride, allyl chloride, allyl bromide, methallyl chloride, and crotyl chloride.

In a first of said two general methods for preparing the organopolysiloxane photosensitizers of this invention the alkenyloxybenzophenone reactant is reacted with an organohydrogenpolysiloxane reactant bearing at least one silicon-bonded hydrogen atom to provide the organopolysiloxane photosensitizers of this invention.

The organohydrogenpolysiloxane reactant used in the hydrosilylation reaction can be straight chained, branched chained, cyclic or network. The degree of polymerization is greater than 2 and can go as high as the maximum possible degree of polymerization which can take place without destroying the hydrogen-silicon bonds. For the reasons noted above for the organopolysiloxane photosensitive of this invention, however, the degree of polymerization of the organohydrogenpolysiloxane reactant is likewise preferably less than 1000.

The organohydrogenpolysiloxane reactant is preferably composed of siloxane units having the formula $R_c^4H_dSiO_{(4-c-d)/2}$ wherein $R^4$, c, d, and c+d having the same general and preferred meanings as noted above with the requirement that at least one of the siloxane units bears a silicon-bonded hydrogen atom.

A preferred organohydrogenpolysiloxane to be used in this first method of photosensitizer preparation has the formula $R_3{}^4SiO(R_2{}^4SiO)_x(R^4HSiO)_wSiR_3{}^4$ wherein x and w denote integers whose sum has a value of less than 1000. After the hydrosilylation reaction with the alkenyloxybenzophenone reactant, this preferred organohydrogenpolysiloxane will give rise to the preferred organopolysiloxane photosensitizer noted above and having the formula $R_3{}^4SiO(R_2{}^4SiO)_x(R^4HSiO)_y(R^4QSiO)_zSiR_3{}^4$ wherein the sum of y+z has a value equal to the value of w. To obtain the methyl-containing organopolysiloxane photosensitizers that are particularly useful in methyl silicone photocurable resins referred to above and delineated below, all $R^4$ groups in the organohydrogenpolysiloxane reactant are methyl groups. Additionally, the alkenyloxybenzophenone reactant preferably has the formula

$C_6H_5\overset{O}{\underset{\parallel}{C}}C_6H_4OCH_2CH=CH_2.$

As noted above, x can have a value of zero; however, it is typically greater than zero in the organohydrogenpolysiloxane reactant. Also, as noted above, y can have a value of zero, a condition resulting from the complete reaction of silicon-bonded hydrogen atoms with alkenyloxybenzophenone, and the value of w then equals the value of z.

In a second of said two general methods for preparing the organopolysiloxane photosensitizers of this invention an alkenyloxybenzophenone reactant is first reacted, by a hydrosilylation reaction, with a silane which contains at least one silicon-bonded hydrogen atom and at least one silicon-bonded hydrolyzable group or with a siloxane bearing at least two siloxane units and at least one silicon-bonded hydrogen atom. The resulting reaction product, herein designated as the adduct, is thereafter polymerized with itself or with another silane bearing at least one silicon-bonded hydrolyzable group or with another siloxane. Said another silane and said another siloxane are free of silicon-bonded benzophenone-containing groups.

In this second method the alkenyloxybenzophenone reactant is the same as the general and preferred structures described in the first method, above.

The silane reactant containing hydrogen atoms bonded to silicon atoms for the addition reaction with the alkenyloxybenzophenone reactant in said second method preferably has the formula $R_e{}^4HSiZ_{3-e}$. The $R^4$ groups in this formula are the same as noted above. Z denotes a hydrolyzable group such as a halogen atom, preferably a chlorine atom; or an alkoxy group such as a methoxy group or an ethoxy group, or an acyloxy group such as an acetoxy group or a propionoxy group. The value of e is 0, 1 or 2, thereby providing silanes such as $HSiZ_3$ such as trichlorosilane or trimethoxysilane, $R^4HSiZ_2$ such as methyldichlorosilane or methyldimethoxysilane or methyldiacetoxysilane, and $R_2{}^4HSiZ$ such as dimethylchlorosilane.

The adduct resulting from the hydrosilylation reaction between the alkenyloxybenzophenone reactant and the preferred silane reactant has the formula $R_e{}^4Q$-$SiZ_{3-e}$ wherein $R^4$, Q, Z and e are as described above. Examples of suitable silane adducts include, but are not limited to, $QSiZ_3$ such as $QSiCl_3$ or $Q Si(OCH_3)_3$, $(CH_3)QSiZ_2$ such as $(CH_3)QSiCl_2$ or $(CH_3)QSi(OCH_3)_2$ or

$(CH_3)QSi(O\overset{O}{\underset{\parallel}{C}}CH_3)_2$ and $(CH_3)_2QSiZ$ such as $(CH_3)_2QSiCl$ wherein Q is most preferably the

$C_6H_5\overset{O}{\underset{\parallel}{C}}C_6H_4OCH_2CH_2CH_2-$ group.

The siloxane reactant containing at least two siloxane units and at least one silicon-bonded hydrogen atom for the hydrosilylation reaction with the alkenyloxybenzophenone reactant in said second method can be the organohydrogenpolysiloxane reactant denoted above in the first method of this invention. As noted above, this preferred organohydrogenpolysiloxane can be straight chained, branched chained, cyclic or network in structure. The adduct resulting from a hydrosilylation reaction between the alkenyloxybenzophenone reactant and this organohydrogenpolysiloxane reactant is, of course, the organopolysiloxane photosensitizer that is produced by the above-described first method of preparation; however, in the second method of preparation said adduct is further reacted by a siloxane polymerization reaction, with another silane or another siloxane, both free of silicon-bonded Q groups, to produce new organopolysiloxane photosensitizers of this invention. In this second method of preparation the organohydrogenpolysiloxane reactant is preferably cyclic in structure such as $(CH_3HSiO)_4$, i.e. tetramethyl-tetrahydrocyclotetrasiloxane, or $(CH_3HSiO)_3$, i.e. trimethyl-trihydrocyclotrisiloxane, or larger cyclics or mixtures thereof.

In this second method the siloxane reactant containing at least two siloxane units and at least one silicon-bonded hydrogen atom can also be an organohydrogenpolysiloxane further containing silicon-bonded hydroxyl groups or silicon-bonded hydrolyzable groups which are convertible to silicon-bonded hydroxyl groups. These hydrolyzable groups are the same as the Z groups denoted above.

Examples of organohydrogenpolysiloxane reactants containing hydrolyzable groups or hydroxyl groups include hydroxyl-endblocked organohydrogenpolysiloxane such as $HO\{(CH_3)_2SiO\}_x\{(CH_3)(H)SiO\}_wH$ or methoxy-endblocked organohydrogenpolysiloxanes such as $(CH_3O)_2(CH_3)SiO\{(CH_3)_2SiO\}_x\{(CH_3)(H)SiO\}_wSi(CH_3)(OCH_3)_2$ wherein x and w are as noted above.

For hydrosilylation addition reactions in either method of this invention between alkenyloxybenzophenone derivatives and silanes or siloxanes containing hydrogen atoms bonded directly to silicon atoms, catalysts to be used are benzoyl peroxide, di-t-butyl peroxide or other peroxides; platinum, palladium, rhodium, nickel, cobalt or other metals in powdered form or in complexes. Platinum sponge, platinum black, chloroplatinic acid, the reaction product of chloroplatinic acid and alcohol, a complex of chloroplatinic acid and vinyl siloxane and other platinum catalysts are preferably used. This addition reaction is preferably carried out so that the alkenyloxybenzophenone derivative is reacted at 1 mole % or less with respect to the hydrogen atoms bonded to the silicon atoms. This addition reaction can be carried out in the absence or presence of a solvent. Typically, an alkenyloxybenzophenone derivative is first heated and melted, then mixed with a silane or siloxane containing hydrogen atoms bonded to silicon atoms. While these are being vigorously mixed, a catalyst is added to promote the reaction. The addition reaction is completed in a homogeneous system. However, it is preferable to add a solvent such as benzene, toluene or xylene to give a homogeneous starting system for the reaction.

The adduct that is obtained in the first step of the second method of this invention is subsequently further reacted, in a siloxane polymerization reaction, with itself or with another silane bearing at least one silicon-bonded hydrolyzable group or with another siloxane. Said siloxane polymerization reaction can be a hydrolysis and siloxane condensation reaction and/or a siloxane equilibration reaction in the well-known manner. The hydrolysis and condensation can be carried out by conventionally known methods if hydrolyzable groups are present. If hydrolyzable groups are not present, the equilibrium polymerization can be carried out in the presence of a conventionally known basic or acidic catalyst.

Said other silanes or other siloxanes are those which do not contain groups possessing the benzophenone derivative structure. Examples are organotrichlorosilane, diorganodichlorosilane, triorganochlorosilane, organotrialkoxysilane, diorganodialkoxysilane, triorganoalkoxysilane, organotriacetoxysilane, diorganodiacetoxysilane, triorganoacetoxysilane, diorgano(methyl ethyl ketoxime)silane, tetraorganodialkoxydisiloxane, pentaorganotrialkoxytrisiloxane, triorganopentaalkoxytrisiloxane, α, ω-dihydroxydiorganosiloxane oligomer, octaorganocyclotetrasiloxane and hexaorganodisiloxane.

The photopolymerization sensitizers of the present invention can be applied to various photosensitive resins. However, their characteristics are best exhibited when they are applied specifically to photosensitive silicone resins and photosensitive organopolysiloxanes. In other words, the sensitizers widely used conventionally and containing benzophenone, Michler's ketone and benzoin as major ingredients have at most 2% miscibility with photosensitive silicone resins and photosensitive organopolysiloxanes. However, the sensitizers of the present invention are miscible in much larger amounts with the photosensitive silicone resins and photosensitive organopolysiloxanes. In a mixed state with photosensitive silicone resins or photosensitive organopolysiloxanes, they do not separate out or form deposits even after long-term storage. They do not have the problems of conventional sensitizers such as benzophenone and Michler's ketone, in which the sensitizers crystallize out after radiation-hardening. They can be used at high concentrations. A high sensitization effect can be expected.

The miscibilities of the photopolymerization sensitizers of the present invention will be good if the sensitizers are selected so that they have molecular structures or contain organic groups identical or similar to the molecular structures or organic groups of photosensitive silicone resins and photosensitive organopolysiloxanes.

For example, if a photosensitive organopolysiloxane has a linear structure, is liquid and contains methyl groups as the major organic groups, it is preferable to select a photopolymerization sensitizer of the present invention which also has a linear or cyclic structure, is liquid and contains methyl groups as the major organic groups, other than those groups possessing the benzophenone derivative structure.

The sensitizers of the present invention can be applied to those photosensitive silicone resins and photosensitive organopolysiloxanes known to date, such as organopolysiloxanes containing acryloxy groups (Japanese Patent Sho 53(1978)-2911, Japanese Patent Sho 53(1978)-36515, and Japanese Patent Sho 55(1980)-4770), compositions of organopolysiloxanes having SiH bonds and organopolysiloxanes containing unsaturated groups such as vinyl groups (Japanese Patent Sho 52(1977)-40334), and compositions of organopolysiloxanes having mercapto groups and organopolysiloxanes containing unsaturated groups such as vinyl groups (Japanese Patent Sho 54(1979)-43017). The sensitizers of the present invention are highly miscible with all of the photosensitive silicone resins and photosensitive organopolysiloxanes. They can be blended in large amounts. They show a high sensitizing action. In the present invention, the term "photosensitization" refers to sensitization by ultraviolet rays, electrons and other high-energy rays.

The following examples are disclosed to further illustrate, and to teach how to practice, the present invention. These examples shall not limit the present invention as delineated by the appended claims.

All parts and percentages refer to parts by weight and percentage by weight, unless otherwise indicated. Me denotes the methyl group. Viscosities are the values at 25° C.

EXAMPLE 1

This example illustrates an organopolysiloxane photosensitizer of this invention, its preparation by the second method of this invention and its use.

4-Hydroxybenzophenone (100 parts) was dissolved in tetrahydrofuran (100 parts). Potassium hydroxide (30.9 parts) was added, heated and stirred until completely dissolved. Allyl chloride (46.4 parts) and potassium iodide (42 parts) were added to this solution. The mixture was refluxed for 8 hours. After cooling, it was washed with water and the solvent removed by distillation. A crude product of the desired 4-allyloxybenzophenone was obtained. It was recrystallized in n-hexane to obtain 110 parts of 4-allyloxybenzophenone (melting point 71° C.) at 72% yield.

NMR (a value of δ in carbon tetrachloride) measured values were 4.20 (m, 2H), 4.65–5.20 (m, 2H), 5.30–6.00 (m, 1H) and 6.50–7.50 (m, 9H).

4-Allyloxybenzophenone (2 parts) and tetramethyl tetrahydrogen cyclotetrasiloxane (2 parts) were heated to 80° C. After mixing by stirring, 0.01 part of a 1% chloroplatinic acid solution in tetrahydrofuran (THF) was dripped into it. After stirring for 1 hour, hexamethyldisiloxane (1 part), and octamethylcyclotetrasiloxane (37 parts) were added. Trifluoromethane sulfonic acid (0.01 part) was added as a copolymerization catalyst. After the copolymerization, the solution was neutralized with sodium carbonate and filtered. A photopolymerization sensitizing organopolysiloxane (40 parts) with a viscosity of 200 cp, $n_D^{25}$ 1.4122, and an average composition formula

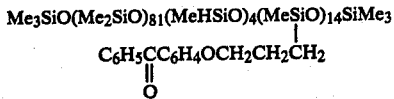

was obtained. This material (0.5 part) was mixed, and was completely miscible, with a photosensitive siloxane resin consisting of a mixture of 5 parts of a trimethylsiloxy-terminated block polymer containing about 78 mole % Me$_2$SiO units and about 22 mole % CH$_2$=CHMeSiO units, and 0.5 part of a trimethylsiloxy terminated polymer of HMeSiO units. This mixture was made into a film of 10 μm thickness and irradiated with ultraviolet rays from 160 W/cm high-voltage mercury lamps from a distance of 10 cm. Hardening was achieved in 10–15 seconds. No separation or deposition of the photopolymerization sensitizer was observed even after storing the hardened material.

EXAMPLE 2

This example illustrates an organopolysiloxane photosensitizer of this invention, its preparation by the first method of this invention and its use.

4-Allyloxybenzophenone (1 part) and a methylpolysiloxane (10 parts), represented by an average composition formula

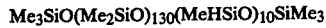

and containing hydrogen atoms bonded to silicon atoms, were heated to 90° C. After mixing by stirring, 0.01 part of a 1% chloroplatinic acid solution in THF was dripped into the mixture. After stirring for 30 minutes, the reaction solution was cooled and filtered to obtain 8 parts of a photopolymerization-sensitizing organopolysiloxane with a viscosity of 230 cp and n$_D^{25}$ 1.4224. This material (0.5 part) was mixed with a photosensitive siloxane resin consisting of a mixture of 6 parts of a dimethylvinylsiloxy terminated polymer of Me$_2$SiO units, and 4 parts of a trimethylsiloxy-terminated block polymer containing about 97% Me$_2$SiO units and about 3 mole % mercaptopropylmethylsiloxy units. At this time, the vinyl groups and the mercaptopropyl groups were about 1 mole %. The photopolymerization sensitizer was completely miscible. This composition was made into a film of 10 μm thickness and irradiated with ultraviolet rays from 160 W/cm high-voltage mercury lamps from a distance of 10 cm. It hardened rapidly in less than 1 second. Even after storage of the hardened material, no separation or deposition of the photopolymerization sensitizer was observed.

EXAMPLE 3

4-Allyloxybenzophenone (1 part) and a methylpolysiloxane (20 parts) represented by the average composition formula

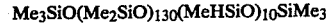

and containing hydrogen atoms bonded to silicon atoms, were heated to 90° C. After mixing by stirring, 0.01 part of a 1% chloroplatinic acid solution in THF was dripped into it. After stirring for 30 minutes, the mixture was cooled and filtered to obtain 18 parts of a photopolymerization-sensitizing organopolysiloxane with a viscosity of 210 cp and n$_D^{25}$ 1.4130. This material (0.5 part) was mixed, and was completely miscible, with a photosensitive siloxane resin consisting of a mixture of 5 parts of a trimethylsiloxy-terminated block polymer containing about 78 mole % Me$_2$SiO units and about 22 mole % CH$_2$=CHMeSiO units and 0.5 part of a trimethylsiloxy-terminated polymer of HMeSiO units.

This mixture was made into a film of 100 μm thickness, and was irradiated with ultraviolet rays from 160 W/cm high-voltage mercury lamps from a distance of 10 cm. It hardened in 5 seconds. Even after storing the hardened material, no separation or deposition of the photopolymerization sensitizer was observed.

EXAMPLE 4

2-Hydroxy-4-methoxybenzophenone (114 parts) was dissolved in tetrahydrofuran (100 parts). Potassium hydroxide (30.9 parts) was added. By heating and stirring, complete dissolution was achieved. Allyl chloride (46.4 parts) and potassium iodide (4.2 parts) were added to this solution, which was then heated and refluxed for 8 hours. After cooling, it was washed with water and the solvent was removed by distillation. A crude product of the desired 2-allyloxy-4-methoxybenzophenone was obtained. It was recrystallized in n-hexane to obtain 125 parts of 2-allyloxy-4-methoxybenzophenone (melting point 40° C.) at 93% yield.

2-Allyl-4-methoxybenzophenone (13 parts), a methylpolysiloxane (20 parts) represented by an average composition formula

and containing hydrogen atoms bonded to silicon atoms, and toluene (10 parts) were heated to 90° C. After mixing by stirring, 0.01 part of a 1% chloroplatinic acid/THF solution was dripped into it. After stirring for 30 minutes, the solvent was removed by distillation. It was filtered to obtain 18 parts of a photopolymerization-sensitizing organopolysiloxane with a viscosity of 200 cp and n$_D^{25}$ 1.4075. This material (1 part) was mixed and was completely miscible, with a photosensitive siloxane resin consisting of a mixture of 5 parts of a trimethylsiloxy-terminated block polymer containing about 92 mole % Me$_2$SiO units and about 8 mole % CH$_2$=CHSiMeO units and 0.5 part of a trimethylsiloxy-terminated polymer of HMeSiO units. This mixture was made into a film of 10 μm thickness and irradiated with ultraviolet rays from 160 W/cm high-voltage mercury lamps from a distance of 10 cm. It hardened in 1 minute. Even after storage of the hardened material, no separation or deposition of the photopolymerization sensitizer was observed.

That which is claimed is:

1. An organopolysiloxane photosensitizer comprising an average of more than two siloxane units, of which at least an average of one siloxane unit per organopolysiloxane molecule has the formula $Q_aR_b^4SiO_{(4-a-b)/2}$, wherein Q denotes a benzophenone-containing group having the formula

R$^1$ and R$^2$ each denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; R$^3$ denotes a divalent hydrocarbon group having from 2 to 10 carbon atoms; $R^4$ denotes a monovalent hydrocarbon group or a halogenated monovalent hydrocarbon group; m is an integer of from 1 to 5, n is an integer of from 1 to 4, a is an integer of from 1 to 3, b is an integer of from 0 to 2 and a+b is an integer of from 1 to 3.

2. A composition according to claim 1 wherein any siloxane unit in the organopolysiloxane photosensitizer molecules not bearing a Q group has the formula $R_c^4H_dSiO_{(4-c-d)/2}$ wherein c, d and c+d are integers of from 0 to 3.

3. A composition according to claim 2 wherein the average number of Q groups in the organopolysiloxane molecule is equal to from 0.2% to 50% of the total number of Q groups plus $R^4$ groups in the organopolysiloxane molecule.

4. A composition according to claims 1, 2 or 3 wherein each $R^4$ denotes a methyl group and a has a value of 1.

5. A composition according to claim 4 wherein the organopolysiloxane photosensitizer has the formula $R_3^4SiO(R_2^4SiO)_x(R^4HSiO)_y(R^4SiO)_zSiR_3^4$ wherein x, y and z denote

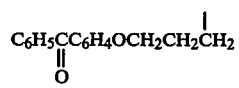

integers whose sum has a value of less than 1000.

6. A method for preparing an organopolysiloxane photosensitizer comprising an average of more than two siloxane units, of which at least an average of one siloxane unit per organopolysiloxane molecule has the formula $Q_aR_b^4SiO_{(4-a-b)/2}$, said method comprising reacting, by a hydrosilylation reaction, an alkenyloxybenzophenone reactant having the formula

and an organohydrogenpolysiloxane reactant containing more than two siloxane units and at least one silicon-bonded hydrogen atom per molecule, wherein Q denotes a benzophenone-containing group having the formula

at each occurrence $R^1$ and $R^2$ denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; $R^3$ denotes a divalent hydrocarbon group having from 2 to 10 carbon atoms; $R^4$ denotes a monovalent hydrocarbon group or a halogenated monovalent hydrocarbon group; $R^5$ denotes an aliphatically unsaturated monovalent hydrocarbon group having the same number of carbon atoms as the $R^3$ group; m is an integer of from 1 to 5, n is an integer of from 1 to 4, a is an integer of from 1 to 3, b is an integer of from 0 to 2 and a+b is an integer of from 1 to 3; the $R^5$ group becoming the $R^3$ group during said hydrosilylation reaction.

7. A method according to claim 6 wherein the organohydrogenpolysiloxane consists of siloxane units having the formula $R_c^4H_dSiO_{(4-c-d)/2}$ wherein c, d and c+d are integers of from 0 to 3.

8. A method according to claim 7 wherein each $R^4$ denotes a methyl group.

9. A method according to claim 6, 7 or 8 wherein the organohydrogenpolysiloxane has the formula $R_3^4SiO(R_2^4SiO)_x(R^4HSiO)_wSiR_3^4$ wherein x and w denote integers whose sum has a value of less than 1000.

10. A method according to claim 9 wherein the alkenyloxybenzophenone reactant has the formula

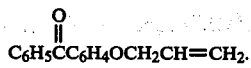

11. A method for preparing an organopolysiloxane photosensitizer comprising an average of more than two siloxane units, of which an average of at least one siloxane unit per organopolysiloxane molecule has the formula $Q_aR_b^4SiO_{(4-a-b)/2}$, said method comprising (A) reacting, by a hydrosilylation reaction to form an adduct, an alkenyloxybenzophenone reactant having the formula

and a silane bearing at least one silicon-bonded hydrogen atom and at least one silicon-bonded hydrolyzable group or a siloxane bearing at least two siloxane units and at least one silicon-bonded hydrogen atom; and (B) polymerizing the adduct or copolymerizing the adduct with another silane bearing at least one silicon-bonded hydrolyzable radical or with a siloxane, both being free of Q groups, to provide the organopolysiloxane photosensitizer, wherein Q denotes a benzophenone-containing group having the formula

at each occurrence $R^1$ and $R^2$ denote, independently, a hydrogen atom, a halogen atom, a monovalent hydrocarbon group having from 1 to 10 carbon atoms, an alkoxy group, a thioalkoxy group, a hydroxyl group, an amino group or a dialkylamino group; $R^3$ denotes a divalent hydrocarbon group having from 2 to 10 carbon atoms; $R^4$ denotes a monovalent hydrocarbon group or a halogenated monovalent hydrocarbon group; $R^5$ denotes an aliphatically unsaturated monovalent hydrocarbon group having the same number of carbon atoms as the $R^3$ group; m is an integer of from 1 to 5, n is an integer of from 1 to 4, a is an integer of from 1 to 3, b is an integer of from 0 to 2 and a+b is an integer of from 1 to 3; the $R^5$ group becoming the $R^3$ group during said hydrosilylation reaction.

12. A method according to claim 11 wherein the siloxane bearing at least two siloxane units and at least one silicon-bonded hydrogen atom consists of siloxane units having the formula $R_c^4H_dSiO_{(4-c-d)/2}$ wherein c, d and c+d are integers of from 0 to 3.

13. A method according to claim 12 wherein the siloxane bearing at least two siloxane units and at least one silicon-bonded hydrogen atom is tetramethyl-tetrahydrocyclotetrasiloxane having the formula $(CH_3HSiO)_4$.

14. A method according to claim 11 wherein the silane bearing at least one silicon-bonded hydrogen atom and at least one silicon-bonded hydrolyzable group has the formula $R_e^4HSiZ_{3-e}$ wherein e is an integer of from 0 to 2 and Z denotes a chlorine atom, an alkoxy group or an acyloxy group.

15. A method according to claim 14 wherein $R^4$ denotes a methyl radical and e has a value of 1.

16. A method according to claims 11, 12, 13, 14 or 15 wherein the alkenyloxybenzophenone reactant has the formula

* * * * *

UNITED STATES PATENT AND TRADEMARK OFFICE
CERTIFICATE OF CORRECTION

PATENT NO. : 4,467,082
DATED : August 21, 1984
INVENTOR(S) : Akihiko Shirahata, Keiichi Kishimoto It is certified that error appears in the above-identified patent and that said Letters Patent is hereby corrected as shown below:

In column 6, line 62, "photosensitive" should read -- photosensitizers --.

In column 13, lines 22-29,

"$R_3^4SiO(R_2^4SiO)_x(R^4HSiO)_y(R^4SiO)_zSiR_3^4$ wherein x,y and z denote $$C_6H_5\overset{O}{\underset{\|}{C}}C_6H_4OCH_2CH_2CH_2"$$

should read

-- $R_3^4SiO(R_2^4SiO)_x(R^4HSiO)_y(R^4SiO)_zSiR_3^4$ $$C_6H_5\overset{O}{\underset{\|}{C}}C_6H_4OCH_2CH_2CH_2$$

wherein x, y and z denote --.

Signed and Sealed this

Nineteenth Day of March 1985

[SEAL]

Attest:

DONALD J. QUIGG

Attesting Officer    Acting Commissioner of Patents and Trademarks